United States Patent [19]

Avery

[11] Patent Number: 5,010,380

[45] Date of Patent: Apr. 23, 1991

[54] VOLTAGE STRESS ALTERABLE ESD PROTECTION STRUCTURE

[75] Inventor: Leslie R. Avery, Flemington, N.J.

[73] Assignee: David Sarnoff Research Center, Inc.

[21] Appl. No.: 516,497

[22] Filed: May 4, 1990

[30] Foreign Application Priority Data

May 17, 1989 [GB] United Kingdom ............... 8911360

[51] Int. Cl.$^5$ .......................................... H01L 29/06
[52] U.S. Cl. .................................. 357/23.13; 357/34; 361/100
[58] Field of Search ...................... 357/41, 23.13, 34; 361/100

[56] References Cited

U.S. PATENT DOCUMENTS

| 4,400,711 | 8/1983 | Avery | 357/43 |
|---|---|---|---|
| 4,405,933 | 9/1983 | Avery | 357/13 |
| 4,484,244 | 11/1984 | Avery | 361/56 |
| 4,631,567 | 12/1986 | Kokado et al. | 357/38 |
| 4,633,283 | 12/1986 | Avery | 357/23.13 |
| 4,692,781 | 9/1987 | Rountree et al. | 357/23.13 |
| 4,757,363 | 7/1988 | Bohm et al. | 357/23.13 |
| 4,760,433 | 7/1988 | Young et al. | 357/23.13 |
| 4,811,155 | 3/1989 | Kuriyama et al. | 357/23.13 |
| 4,855,620 | 8/1989 | Duvvury et al. | 307/448 |
| 4,870,530 | 9/1989 | Hurst et al. | 357/23.13 |
| 4,928,157 | 5/1990 | Matsunaga et al. | 357/23.13 |

FOREIGN PATENT DOCUMENTS

| 0055644 | 7/1982 | European Pat. Off. | 357/23.13 |
|---|---|---|---|
| 0225586 | 6/1987 | European Pat. Off. | 357/23.13 |
| 52-003389 | 1/1977 | Japan | 357/23.13 |
| 56-165356 | 12/1981 | Japan | 357/23.13 |
| 58-043557 | 3/1983 | Japan | 357/23.13 |
| 58-142578 | 8/1983 | Japan | 357/23.13 |
| 59-080973 | 5/1984 | Japan | 357/23.13 |
| 63-064358 | 3/1988 | Japan | 357/23.13 |

*Primary Examiner*—Jerome Jackson, Jr.
*Assistant Examiner*—Dang Xuan Hung
*Attorney, Agent, or Firm*—W. J. Burke

[57] ABSTRACT

A protection structure comprises a semiconductor substrate of a first conductivity type with a region of second conductivity type in the substrate at the surface thereof. A region of second conductivity type has disposed therein first and second regions of the second conductivity type, a third region of the first conductivity type adjacent the surface of the substrate, and a fourth region of the second conductivity type adjacent the substrate surface adjacent the third region. A shallow field region extends a distance into the region of second conductivity type between the first and second regions. A first electrical contact overlies the surface of the first region and a second electrical contact overlies the third and fourth regions. A transient-responsive means responsive to a high voltage transient applied between the terminal and the substrate for forming a transistor having an emitter electrode formed in the field layer, a base electrode formed in the region of second conductivity type, and a collector electrode formed in the substrate, and an avalanche breakdown diode formed between the emitter of the transistor and the contact is also included.

15 Claims, 2 Drawing Sheets

VOLTAGE STRESS ALTERABLE ESD PROTECTION STRUCTURE

FIELD OF THE INVENTION

The present invention relates to electrical protection devices, and more particularly to devices providing protection for monolithic integrated circuits against relatively large voltage transients.

BACKGROUND OF THE INVENTION

Integrated circuits are incorporated in many types of electrical equipment. Such integrated circuits are generally vulnerable to damage from high voltage transients. In some equipment, high voltage transients may have positive and/or negative peak levels of 100 volts or more and may have a duration of several microseconds. High voltage electrostatic discharge (ESD) transients can also result from a user becoming electrostatically charged, for example, by friction or by induction and touching equipment controls.

Protection devices applicable to the protection of integrated circuits from damage that would otherwise result from a high voltage transient are known in the art. Such devices are described in, for example, Avery, U.S. Pat. No. 4,414,711; Avery, U.S. Pat. No. 4,405,933; Kokado et al., U.S. Pat. No. 4,631,567; and Rountree et al., U.S. Pat. No. 4,692,781.

In providing its protective function, it is also desirable that a protection device be able to handle transients associated with relatively large energy without itself being destroyed or having its protective capability significantly impaired. Furthermore, it is desirable that the protective device provide an indication of having been subjected to a large voltage transient.

SUMMARY OF THE INVENTION

A semiconductor protection circuit comprises a semiconductor substrate of a first conductivity type, and a region of second conductivity type in the substrate at a surface thereof. The region of second conductivity type has disposed therein first and second regions of the second conductivity type. A third region of the first conductivity type is in the substrate at the surface of the substrate, and a fourth region of the second conductivity type is in the substrate at the surface of the substrate adjacent the third region. A shallow field region of first conductivity type extends a distance from the surface into the region of second conductivity type and extends between the first and second regions. A first electrical contact overlies and contacts the first region of the second conductivity type. A second electrical contact overlies the third and fourth regions.

A transient-responsive means is responsive to a high voltage transient being applied between a terminal of an integrated circuit to be protected and a source of reference potential for forming a transistor of second polarity type having an emitter electrode formed in the field layer, a base electrode formed in the region of second conductivity type, and a collector electrode formed in the semiconductor substrate, and an avalanche breakdown diode formed between the emitter of the transistor and the electrode contact.

In another embodiment of the invention, a semiconductor protection circuit comprises a semiconductor substrate of a first conductivity type, the substrate having adjacent a surface thereof a relatively shallow, relatively high conductivity, field layer of the first conductivity type. A region of second conductivity type is in the substrate at the surface and has disposed therein first and second regions of the second conductivity type. A further region of first conductivity type is in the substrate at the surface. A further region of the second conductivity type is in the substrate at the surface of the substrate adjacent the further region of the first conductivity type. A terminal overlies the surface of the further region of the second conductivity type.

A bipolar transistor of a particular polarity type, e.g. NPN or PNP, has an emitter electrode comprising the further region of first conductivity type, a base electrode formed by the substrate, and a collector electrode comprising the second region of second conductivity type. A transient-responsive structure is responsive to a high voltage transient between the terminal and the substrate which alters the doping profile thereby forming a transistor of second conductivity polarity type having an emitter electrode comprising the field layer, a base electrode comprising the region of second conductivity type, a collector electrode formed by the substrate, and an avalanche breakdown diode comprising the emitter of the transistor of second conductivity type and the terminal.

In accordance with another aspect of the invention, a first transistor of a first polarity type, has a collector electrode resistively coupled to a terminal of an integrated circuit to be protected against a high voltage transient, an emitter electrode coupled to a point of reference potential, and a base electrode coupled to the point of reference potential. A transient-responsive arrangement is responsive to an occurrence of a high voltage transient for thereupon altering the doping profile and forming in the integrated circuit a second transistor of second polarity type having an emitter electrode coupled to the terminal, a collector electrode coupled to the base electrode of the first transistor, and a base electrode coupled to the collector electrode of the first transistor.

BRIEF DESCRIPTION OF THE DRAWING

In the Drawing like items are identified by the same reference numeral and.

DETAILED DESCRIPTION OF THE PREFERRED EMBODIMENTS

Figure 1:
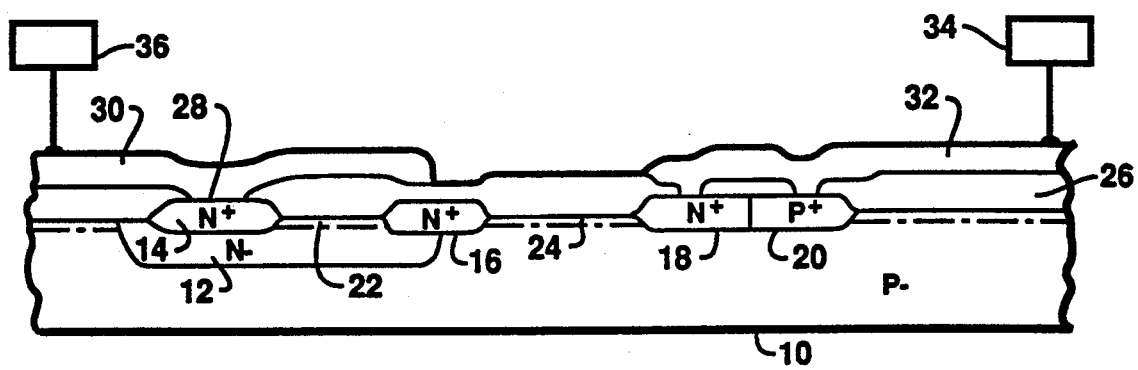
FIG. 1 shows a cross-section, not to scale, of a protection device in accordance with the invention.

In FIG. 1, a circuit is formed in a semiconductor substrate 10 of P type silicon. An $N^-$ well 12 which is relatively lightly doped region, typically $10^{14}$–$10^{15}$/cc, and of relatively low conductivity, is disposed in substrate 10. A first $N^+$ region 14 which is relatively heavily doped region, typically $10^{18}$/cc, and of relatively high conductivity, is disposed within N− well 12. A second N+ region 16 is also formed in the N− well 12 and extends beyond its border into the substrate 10. A third N+ region 18 is disposed in substrate 10 outside of the borders of N− well 12. The N+ regions 14, 16, and 18 are typically formed simultaneously in the same processing step. A first P+ region 20 which is relatively heavily doped and of relatively high conductivity is in substrate 10 adjacent the third N+ region 18 and is preferably in contact therewith so as to form a P+N+ junction therewith. However, it is not essential that N+ region 18 be close to first P+ region 20. Those portions of the substrate 12 adjacent the surface which are not occupied by N+ or P regions, have relatively shallow P+ implant layers 22 and 24 therein. P implant layers 22 and 24 are commonly referred to in the art as field implant regions. They are generally utilized to increase the inversion voltage of the substrate surface, thereby preventing the formation of spurious conduction channels along the surface which may otherwise result from electrical charge trapped in the overlying layers.

An insulating layer 26, such as a silicon oxide, overlies the surface of substrate 10. Insulating layer 26 contains a P type dopant such as boron. Openings are formed in insulating layer 26 over regions 14, 18, and 20 in order to allow the making of electrical contact thereto at a contact surface 28 thereof. A conductive layer 30, which may for example be aluminum, molybdenum, polysilicon or a silicide, overlies insulating layer 26 and makes contact with N+ region 14 and is connected to other circuitry, such as the signal utilization circuitry 21 of FIG. 2, which may be formed on substrate 10. Conductive line 30 may also be connected to a bond pad 36. Another conductive layer 32 overlies insulating layer 26 and makes contact with N+ region 18 and P+ region 20. Conductive layer 32 is also connected to a bond pad 34 for connection to external circuitry. The presence of N− well 12 under contact surface 28 serves to reduce the effect of aluminum penetration which can occur at high current stress levels. Conductive layer 32 is connected to a source of a reference potential.

Figure 2:
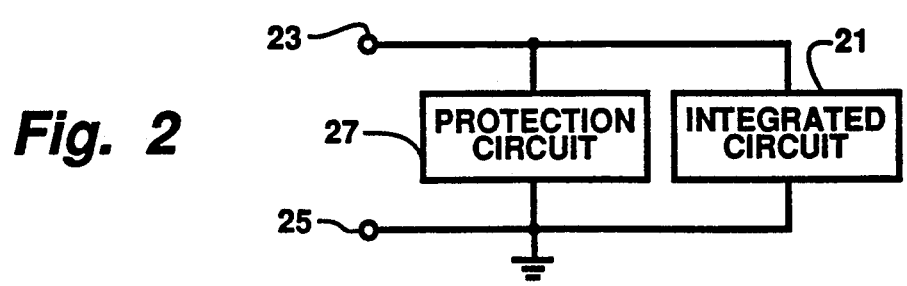
FIG. 2 shows a schematic of exemplary connections of a protection circuit and an integrated circuit of the invention.

FIG. 2 shows one possible arrangement, in which an integrated circuit 21 is connected between a first terminal 23 and a second terminal 25. In the present example, terminal 23 is a supply terminal for a voltage of first polarity and terminal 25 is shown as a supply terminal for a source of reference potential. However, terminal 23 can be an input or output signal terminal rather than a supply terminal. A protection circuit 27 in accordance with the invention is connected between terminals 23 and 25, that is, in parallel with integrated circuit 21. Protection circuit 27 thereby protects integrated circuit 21, by turning on in response to transient voltages to conduct transient energy to a source of reference potential, ground in this example.

Figure 3:
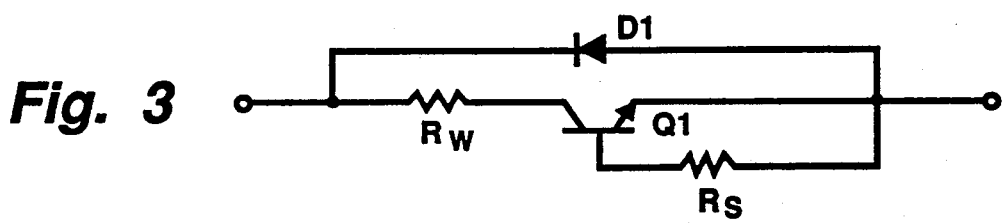
FIG. 3 shows a schematic circuit diagram of a protection device corresponding to the device of FIG. 1.

FIG. 3 shows a schematic equivalent of the circuit formed by the structure of FIG. 1. Resistor Rw is formed substantially by the resistance of the portion of well 12 between N+ region 14 and N+ region 16. The collector of NPN transistor Q1 is formed by N+ region 16, and its emitter is formed by N+ region 18. The base region of transistor Q1 is essentially formed by the P region between N+ regions 16 and 18 which includes the substrate 10 and the P field region 24. A resistor Rs, which is connected between the base and emitter electrodes of transistor Q1 is formed substantially by the portion of substrate 10 between P+ layer 24 and P+ region 20 which is connected to N+ region 18. Diode D1 is formed by well 12 and substrate 10. Well 12 is connected to conductor 30 through N+ region 14 and the substrate 10 is connected to conductor 32 through P+ region 20.

Figure 4:
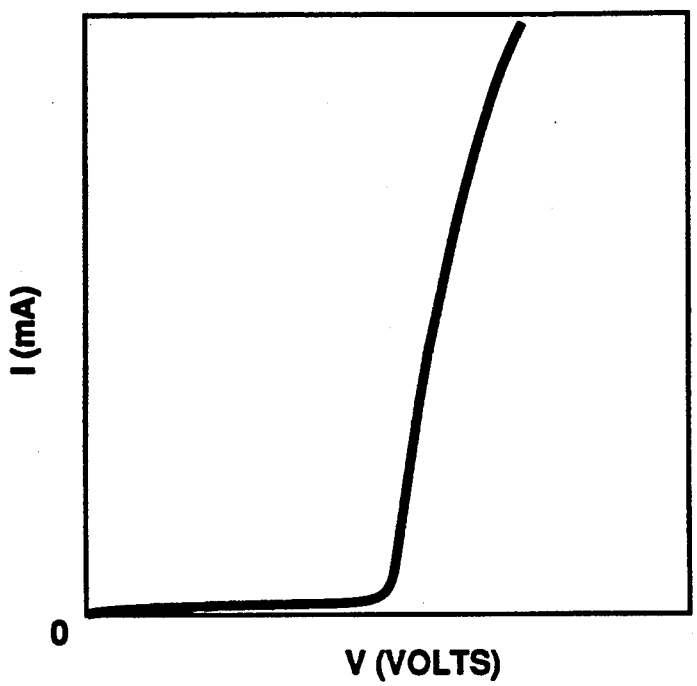
FIG. 4 shows a graph of an electrical characteristic of the device of FIGS. 1 and 3.

In its unstressed condition, that is, before ever having been subjected to high voltage stress, the device of FIGS. 1 and 3 exhibits the characteristics shown in FIG. 4. As shown in FIG. 4, no appreciable current flows until the applied voltage exceeds a definite breakdown level, beyond which the current increases rapidly with increasing voltage. Under the application of a voltage transient, a large current flows, thereby limiting the voltage and providing protection from the transient for circuitry connected to conductor 30.

Further effects of a high level transient on the device of FIGS. 1 and 3 are next considered. During a high level positive current stress event, such as an electrostatic discharge, avalanche breakdown occurs at the junction between N+ region 16 and P+ layer 24. This phenomenon, together with the occurrence of a high intensity electric field resulting from a high positive voltage on conductor 30 causes hot electron injection into oxide insulating layer 26. These charges become trapped and cause enhancement in layer 22, thereby causing layer 22 to become more strongly P type. Furthermore, at high stress levels, the power dissipation level in well 12 results in locally high temperatures being reached. As a result, an exchange of boron dopant takes place from the portion of the field oxide over layer 22 into layer 22, thereby increasing the doping level in layer 22. The action of both effects is to bring about the formation of a thin, more highly doped P layer in layer 22, at the silicon/silicon dioxide interface. This also brings about a qualitative change in the device behavior by thereby forming a bipolar parasitic transistor.

The cessation of the high level transient that brought about the effects described does not lead to a reversal of these changes. Thus, following a high level transient, the device becomes irreversibly "programmed", as will be further discussed with the aid of FIG. 5, which shows the resulting post stressed state of the device and FIG. 6, which shows an equivalent schematic for the structure of FIG. 5.

Figure 5:
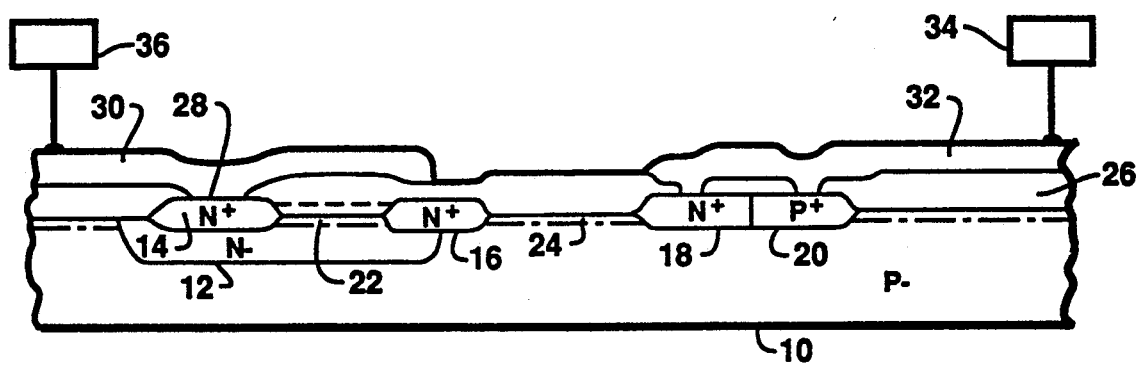
FIG. 5 shows a cross-section, not to scale, of a protection device of another embodiment of the invention.

More particularly with reference to FIG. 5, the formation of a thin, highly doped P+ layer in layer 22 changes the breakdown voltage between layer 22 and N+ regions 14 and 16. Also, P+ layer 22 now forms the emitter electrode of a new PNP bipolar transistor, Q2 in FIG. 5. At the same time, P+ layer 22 also forms the anode of a Zener diode, Z1 in FIG. 6, with the cathode thereof being formed by N+ region 14. Thus, Zener diode Z1 is in series with the emitter electrode of transistor Q2. N− well 12 forms the base electrode of transistor Q2, and the substrate 10 forms the collector electrode.

The remaining components are substantially unaltered from their prestressed form. The resulting arrangement is indicated schematically in FIG. 6. It will now be recognized by one skilled in the art that transistors Q1 and Q2 are interconnected base to collector in a complementary manner so as to form an arrangement exhibiting SCR-like characteristics. A typical characteristic for the post stressed device is shown in FIG. 7, from which the "snap-back" character of the IV characteristic will be apparent. Clearly, the device continues to provide a desirable characteristic for providing protection against high level transients. However, the post stressed behavior is characteristically different from the pre-stressed behavior, and thereby provides a clear indication that the device has been subjected to a high level transient. Such indication can be a very useful analytical tool in engineering diagnostic analysis.

Figure 6:
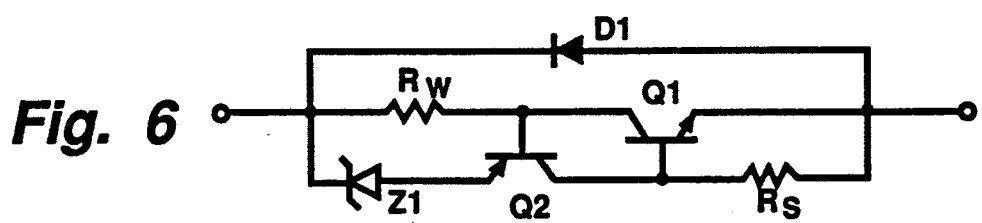
FIG. 6 shows a schematic of a protection device corresponding to the device of FIG. 4.
Figure 7:
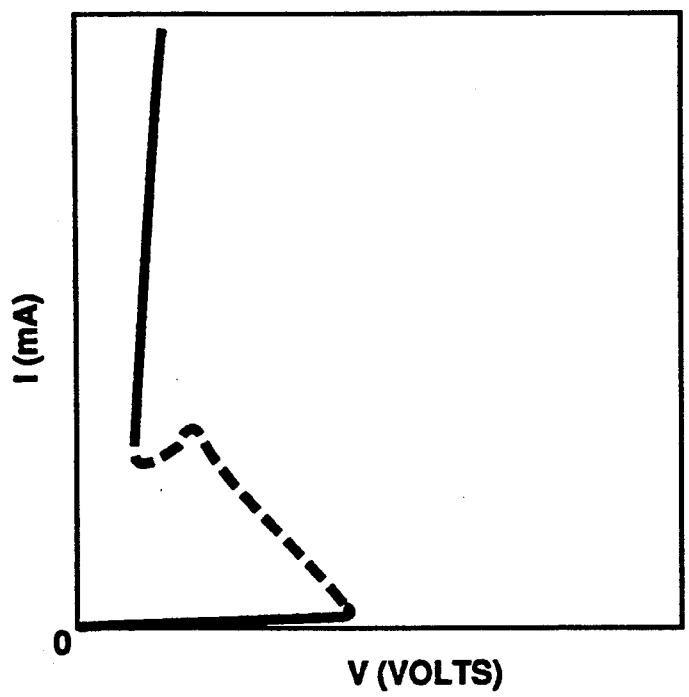
FIG. 7 shows a graph of a characteristic of the device of FIGS. 5 and 6.

Although the structure of FIGS. 5 and 6 has been described in terms of a modification of the structure of FIGS. 1 and 3, it should be understood that the invention is not so limited. For example, in the device of FIGS. 1 and 3, a P+ region can be introduced during fabrication in place of implanted P+ layer 22. The resulting device then corresponds to the device of FIGS. 5 and 6, except that it no longer has utility as an analytical tool.

The devices of the invention can be fabricated utilizing standard photolithographic and etching steps for definition and ion implantation for forming the doped regions. Typically, a silicon substrate is used with, for example, boron as a P type dopant and phosphorus as an N type dopant, other suitable materials may be used.

Modifications of the various embodiments of the invention may occur to one skilled in the art. For example, while the exemplary embodiment has been described in terms of particular conductivity types, converse conductivity types may be used so long as the relative conductivity types remain the same. Such and like modifications are intended to be within the spirit and scope of the invention, and the appended claims.

I claim:

1. A protection circuit comprising:
    a semiconductor substrate of a first conductivity type having a surface;
    a well region of second conductivity type in the substrate at the surface thereof, the well region of second conductivity type having disposed therein spaced first and second regions of second conductivity type having relatively higher conductivity than the well region;
    a third region of first conductivity type in the substrate at the surface thereof and spaced from the well region;
    a fourth region of second conductivity type in the substrate at the surface thereof spaced from the well region and adjacent the third region;
    a terminal overlying and contacting the surface over the first region; and
    a field layer of first conductivity type in the substrate and adjacent the surface thereof extending completely between the first and second regions and completely between the third and fourth regions;
    said circuit forming a first transistor of a first conductivity type in which the fourth region of second conductivity type forms the emitter, the substrate forms the base region, and the second region forms the collector; a diode formed between the well region and the substrate; a resistor formed by the portion of the well region between the first and second regions; and a resistor formed by the portion of the substrate between the second and the third regions.

2. The protection circuit of claim 1, said circuit including an insulating layer overlying the surface of the substrate, said insulating layer containing a conductivity modifier of the first conductivity type.

3. The protection circuit of claim 2 including means increasing the doping of the first conductivity type in the portion of the field layer in the well region between the first and second regions to form a transient-responsive means formed by a transistor of a second conductivity type having the portion of the field layer in the well region as the emitter, the well region as the base region and the substrate as the collector region, and an avalanche breakdown diode formed between the portion of the field layer in the well region and the first region.

4. The protection circuit of claim 3, wherein said first and second transistors are bipolar.

5. A protection circuit formed in an integrated circuit structure comprising:
    a first transistor of a first polarity type, having a collector electrode resistively coupled to a terminal of the integrated circuit to be protected against a high voltage transient and having an emitter electrode and having a base electrode coupled to a point of reference potential; and
    transient-responsive means, responsive to an occurrence of the high voltage transient for thereupon forming in the protection circuit a second transistor of second polarity type having an emitter electrode coupled to said terminal of the integrated circuit, a collector electrode coupled to the base electrode of the first transistor, and a base electrode coupled to the collector electrode of the first transistor, and a Zener diode in series with the emitter electrode and said terminal.

6. The protection circuit of claim 5, wherein a diode is coupled between said terminal and the point of reference potential.

7. A protection device comprising:
    a P type semiconductor substrate having a surface;
    an N− well in the substrate adjacent the surface;
    A first N+ region in the N− well;
    a second N+ region in the N− well and extending beyond the bounds of the N− well;
    a third N+ region in the substrate adjacent the surface and outside the bounds of the N− well;
    a P+ region in the substrate adjacent the surface and outside the bounds of the N− well and adjacent the third N+ region;
    a P field layer extending along the surface of the P substrate;
    an insulating layer overlying the surface of the substrate and having contact openings overlying portions of the first and third N+ regions and the P+ region;
    a first conductive layer overlying a portion of the P field layer situated between the first and second N+ layers and in electrical contact with the first N+ region; and
    a second conductive layer overlying and in contact with both the third N+ region and the P+.

8. The protection device of claim 7, wherein at least a portion of the insulating layer contains a P type dopant.

9. The protection device of claim 8, wherein at least a portion of the P type dopant has diffused into the portion of the P+ field layer situated between the first and second N+ layers.

10. A protection device comprising:
    a semiconductor substrate of first conductivity type having a surface;
    a well region of second conductivity type in the substrate at the surface thereof, the well region of second conductitvity type having disposed therein first and second regions of second conductivity type having relatively higher conductivity than said well region;

a third region of first conductivity type in the substrate at the surface thereof and spaced from the well region;

a fourth region of second conductivity type in the substrate at the surface thereof adjacent the third region and spaced from the well region;

a relatively shallow field region extending a distance into the well region of second conductivity type and extending completely between the first and second regions and into the substrate adjacent the surface and extending completely between the third and fourth regions;

a first electrical contact overlying and in contact with the first and region of second conductivity type; and a second electrical contact overlying and in contact with the third and fourth regions.

11. The protection device of claim 10 wherein said first electrical contact is connected to a terminal of an electrical circuit to be protected and the second electrical contact is connected to a point of refernce potential.

12. A protection circuit comprising:

first and second connecttion points;

first transistor means having emitter, base, and collector electrodes, the emitter electrode coupled to the first connection point;

a diode connected between said first and second connection points;

a first resistance means, coupled to the base electrode and the first connection point; and second resistance means, coupled to the collector electrode and tthe second connection point;

wherein one of said first and second connection points is connected to a terminal of an integrated circuit and other of the first and second connection point is connected to a point of reference potential.

13. The protection circuit of claim 12 including:

a second transistor means of opposite polarity type to that first transistor means, having respective emitter, base and collector electrodes, the collector electrode of the second transistor means being connected to the base electtrode of the first transistor means and the base electrode of the second transistor means being connected to the collector electrode of the first transistor means; and avalanche diode means connected between the emitter electrode of the second transistor and the second connection point.

14. In an integrated circuit including a protection circuit for protecting said integrated circuit from damage resulting from a high voltage transient, the improvement comprising:

a protection circuit which before being subjected to a high voltage stress exhibits a first set of characteristics to provide the integrated circuit with the desired protection but after being subjected to a high voltage stress exhibits a second set of characteristics different from the first set of characteristics to continue to provide the integrated circuit with the desired protection but which allows the determination as to whether the integrated circuit has been subjected to the high voltage stress by the particular set of characteristics which the protection circuit exhibits.

15. The integrated circuit of claim 14 in which the protection circuit exhibits snap-back characteristics prior to being subjected to a high voltage stress and exhibits silicon controlled rectifier characteristics after being subjected to the high voltage stress.

* * * * *